United States Patent [19]
Tedrow et al.

[11] Patent Number: 5,414,669
[45] Date of Patent: May 9, 1995

[54] METHOD AND APPARATUS FOR PROGRAMMING AND ERASING FLASH EEPROM MEMORY ARRAYS UTILIZING A CHARGE PUMP CIRCUIT

[75] Inventors: Kerry D. Tedrow, Orangevale; Robert E. Larsen, Shingle Springs; Chaitanya S. Rajguru, Folsom; Cesar Galindo, Stockton; Jahanshir J. Jayanifard, Sacramento; Mase J. Taub, Elk Grove, all of Calif.

[73] Assignee: Intel Corporation, Santa Clara, Calif.

[21] Appl. No.: 119,719

[22] Filed: Sep. 10, 1993

[51] Int. Cl.$^6$ ............................................. G11C 13/00
[52] U.S. Cl. ................................. 365/226; 365/189.09
[58] Field of Search ................... 365/226, 189.01, 185, 365/189.09, 233

[56] References Cited
U.S. PATENT DOCUMENTS 5,367,489  11/1994  Park et al. ............................. 365/226

*Primary Examiner*—Terrell W. Fears
*Attorney, Agent, or Firm*—Blakely, Sokoloff, Taylor & Zafman

[57] ABSTRACT

An integrated circuit arrangement for providing erase voltages to a flash EEPROM memory array including one charge pump for generating a first high voltage with substantial current which may be used for application to the source terminals of flash EEPROM memory cells during erase and to the gate terminals of flash EEPROM memory cells during programming, and another charge pump for generating a second lower voltage which may be used for application to the drain terminals of flash EEPROM memory cells during programming.

21 Claims, 6 Drawing Sheets

METHOD AND APPARATUS FOR PROGRAMMING AND ERASING FLASH EEPROM MEMORY ARRAYS UTILIZING A CHARGE PUMP CIRCUIT

BACKGROUND OF THE INVENTION

1. Field Of The Invention

This invention relates to computer systems and, more particularly, to methods and apparatus for programming and erasing flash electrically-erasable programmable read only memory (flash EEPROM) arrays.

2. History Of The Prior Art

The use of computers has grown so extensive that the power used by these computers has become significant. In order to reduce the cost of operation as well as the consequent use of energy resources, a substantial move is underway to reduce this power usage. In fact, a major trend in the manufacture of personal computers is to reduce the voltage level required to operate the integrated circuits which are used in the various components of those computers. There is also a simultaneous trend to provide portable computers which function for extended periods. This trend has also has led to attempts to reduce the power used by portable computers.

In order to reduce power consumption and extend battery life, much of the integrated circuitry used in personal computers is being redesigned to run at low voltage levels. This reduces the power usage and allows more components to be placed closer to one another in the circuitry. The circuitry and components used in portable computers are being designed to operate at voltages levels such as 5 volts and 3.3 volts. This helps a great deal to reduce the power needs of such computers.

However, at the same time, the desire to offer more features in portable computers opposes this salutary result. Many of these features require higher voltages to function. For example, one real convenience is the ability to change the basic input/output (BIOS) processes as improvements in a computer or its peripherals occur. Historically, this has been accomplished by removing the electrically programmable read only memory (EPROM) or similar circuitry which provides the read only memory for storing the BIOS processes and replacing it with new circuitry at additional cost. This is a complicated operation beyond the abilities of many computer users. Recently, flash electrically-erasable programmable read only memory (flash EEPROM memory) has been used to store BIOS processes. This memory may be erased and reprogrammed without removing the BIOS circuitry from the computer by running a small update program when the BIOS processes are changed. However, reprogramming flash EEPROM memory requires approximately twelve volts to accomplish effectively; and the lower voltage batteries provided in personal computers are not capable of furnishing this voltage.

Another type of flash EEPROM memory array provides another example of high voltage requirements in portable computers. This type of flash EEPROM memory array provides a new form of long term random access storage. An example of a flash EEPROM memory array which may be used in place of a hard disk drive is described in U.S. patent application Ser. No. 07/969,131, entitled *A Method and Circuitry For A Solid State Memory Disk*, S. Wells, filed Oct. 31, 1992, and assigned to the assignee of the present invention. Such an array provides a smaller lighter functional equivalent of a hard disk drive which operates more rapidly and is not as sensitive to physical damage. Such memory arrays are especially useful in portable computers where space is at a premium and weight is important.

However, these flash EEPROM memory arrays also require much higher voltages for programming and erasing data than can be provided directly by the batteries of low powered portable computers. In other electronic arrangement, charge pump circuits have been used to provide a high voltage from a lower voltage source. However, even though charge pumps have long been available which are capable of providing the voltages necessary for programming and erasing flash EEPROM memory arrays, no arrangement has yet been devised for utilizing these charge pumps to accomplish erasing and programming of flash EEPROM memory arrays using those positive source erase techniques which are used when 12 volts is available from an external source.

There are a number of reasons that this is true. However, the primary reason for the failure is the universal perception that insufficient current can be generated using charge pumps to accomplish the erase process. The positive source method of erasing flash EEPROM memories draws a very substantial amount of current. For example, various source books list the current necessary to erase flash EEPROM memories as 30 milliamperes. For this reason, new negative gate erase techniques which require substantial circuit changes and increases have been devised. We have now discovered that using specially designed charge pumps we are able to generate the amount of current necessary to accomplish positive source erase of flash EEPROM memory arrays. We have also discovered that positive source erase can be accomplished using less current than was expected to be necessary without increasing the required erase time. We have found that charge pumps can be used for providing positive source erase voltages for such arrays. The positive source technique for erasing flash EEPROM memories allows the proven methods of erasing and programming to be used without the need to increase row decode and other circuitry in the manner typical of negative gate erase methods. We have also found that a smaller version of the same charge pump may be used to furnish the voltage with the necessary current at the drain terminal of each memory device during the programming operation.

SUMMARY OF THE INVENTION

It is, therefore, an object of the present invention to provide an arrangement including charge pumping apparatus for erasing and programming flash EEPROM memory arrays using positive source erase techniques.

It is another, more specific, object of the present invention to provide charge pumps for generating the high voltages and currents necessary for erasing flash EEPROM memory arrays using positive source erase techniques.

These and other objects of the present invention are realized in an integrated circuit arrangement which provides a first charge pump for generating a first high voltage with substantial current which may be used for application to the source terminals of flash EEPROM memory cells during erase and to the gate terminals of flash EEPROM memory cells during programming, and a second charge pump for generating a second lower voltage which may be used for application to the drain terminals of flash EEPROM memory cells during programming.

These and other objects and features of the invention will be better understood by reference to the detailed description which follows taken together with the drawings in which like elements are referred to by like designations throughout the several views.

Notation And Nomenclature

Some portions of the detailed descriptions which follow are presented in terms of symbolic representations of operations on data bits within a computer memory. These descriptions and representations are the means used by those skilled in the data processing arts to most effectively convey the substance of their work to others skilled in the art. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. Useful machines for performing the operations of the present invention include general purpose digital computers or other similar devices. In all cases the distinction between the method operations in operating a computer and the method of computation itself should be borne in mind. The present invention relates to apparatus and to a method for operating a computer in processing electrical or other (e.g. mechanical, chemical) physical signals to generate other desired physical signals.

DETAILED DESCRIPTION

Figure 1:
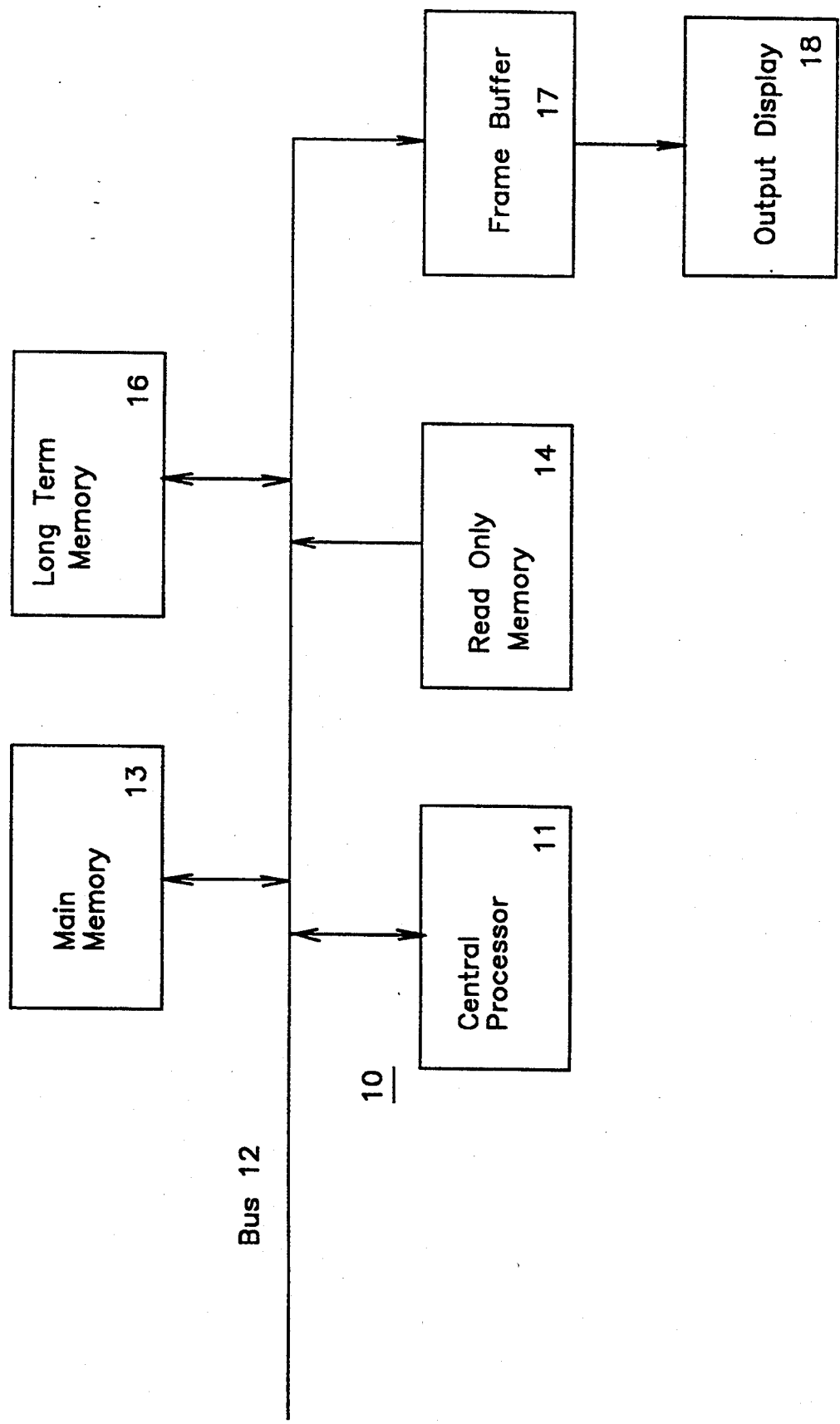
FIG. 1 is a block diagram illustrating a computer system which may utilize the present invention.

Referring now to FIG. 1, there is illustrated a computer system 10. The system 10 includes a central processor 11 which carries out the various instructions provided to the computer 10 for its operations. The central processor 11 is joined to a bus 12 adapted to carry information to various components of the system 10. Joined to the bus 12 is main memory 13 which is typically constructed of dynamic random access memory arranged in a manner well known to those skilled in the prior art to store information during a period in which power is provided to the system 10. Also joined to the bus 12 is read only memory 14 which may include various memory devices well known to those skilled in the art each of which is adapted to retain a particular memory condition in the absence of power to the system 10. The read only memory 14 typically stores various basic functions used by the processor 11 such as basic input/output processes and startup processes typically referred to as BIOS processes. Such memory 14 may be constructed of flash EEPROM memory cells adapted to be modified as various ones of the BIOS processes used by a particular computer are changed. Typically, such flash EEPROM memory will include circuitry for programming and erasing the memory array. If the memory 14 is constructed of flash EEPROM memory cells, it may be modified by running an update process on the computer itself to reprogram the values stored in the memory 14.

Also connected to the bus 12 are various peripheral components such as long term memory 16 and circuitry such as a frame buffer 17 to which data may be written which is to be transferred to an output device such as a monitor 18 for display. The construction and operation of long term memory 16 (typically electro-mechanical hard disk drives) is well known to those skilled in the art. However, rather than the typical electro-mechanical hard disk drive, a flash EEPROM memory array may be used as the long term memory 16. Such flash EEPROM memory arrays are programmed and erased through techniques which utilize voltages greater than those typically available to the integrated circuits of more advanced portable computers. Such flash EEPROM memory arrays typically include circuitry for programing and erasing the memory array. Consequently, in accordance with the present invention, such long term memory arrays as well as memory 14 may provide circuitry for generating high voltages from the lower voltages available from their batteries.

A flash EEPROM memory array is made up of memory cells which include floating gate field effect transistor devices. Such memory transistors may be programmed to change the charge stored on the floating gate, and the condition (programmed or erased) may be detected by interrogating the cells. The conventional method of erasing an array of flash EEPROM memory cells erases all of the cells together (or at least some large block thereof). Typically, this requires the application of 12 volts to the source terminals of all of the memory cells, grounding the gate terminals, and floating the drain terminals. The programming of memory cells is typically accomplished a word at a time but conventionally requires that the drain of selected cells be placed at 6 or 7 volts, the gate at 11 or 12 volts, and the source at ground. Although it has been typical to provide charge pumps to generate higher voltage from the lower voltages available in situations in which batteries do not provide sufficient voltages, this has not been true with flash EEPROM memory arrays. Although such voltage pumps are able to increase the voltage to an appropriate level, prior art charge pumps were not felt to provide sufficient current to generate the power for effectively erasing and programming flash EEPROM memory when erased in the conventional manner.

Figure 2:
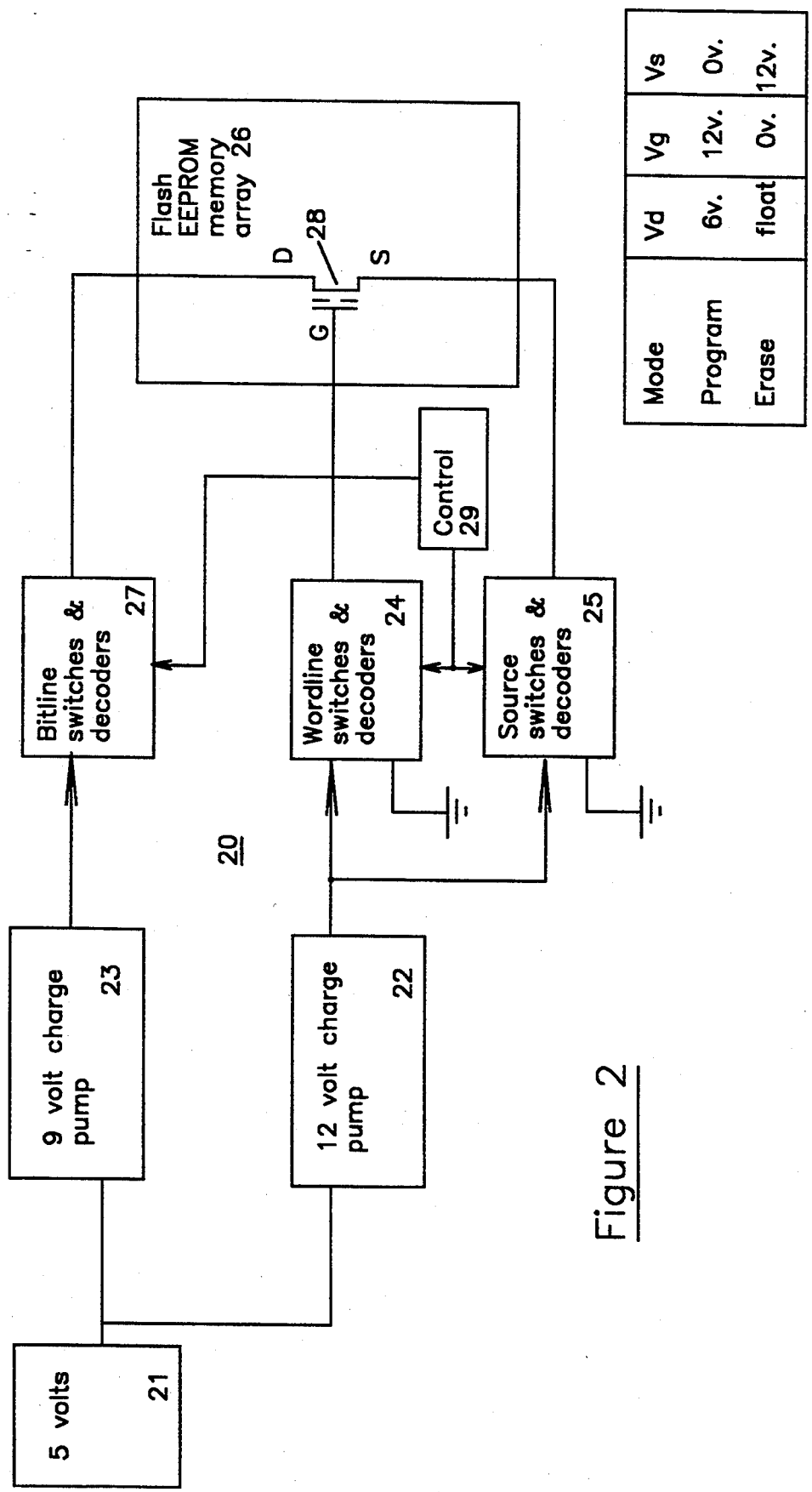
FIG. 2 is a block diagram of a flash EEPROM memory integrated circuit constructed in accordance with the present invention utilizing charge pump circuitry to providing positive source erase voltages.

FIG. 2 is a block diagram which illustrates an integrated circuit 20 including a flash EEPROM memory array 26 and circuitry for programming and erasing the flash EEPROM memory array 26 in accordance with the present invention. This circuit 20 includes a source of voltage 21 such as a low powered battery capable of furnishing 5 volts. Voltage from the source 21 is provided to a pair of charge pump circuits 22 and 23. The charge pump circuit 22 is devised to provide a pumped output voltage of approximately 12 volts while the charge pump 23 is devised to produce a pumped output voltage of approximately 9 volts.

Voltage from the pump 22 is furnished to a set of wordline switches and decoders which in a manner well known to those skilled in the art provide voltages at the gate terminals of flash EEPROM memory transistors 28 (only one transistor 28 is illustrated). Voltage from the pump 22 is also furnished to a set of source switches and decoders 25 which in a manner well known to those skilled in the art provide voltages at the source terminals of flash EEPROM memory transistors 28. The voltage furnished by the pump 23 is furnished to a set of bitline switches and decoders 27 which in a manner well known to those skilled in the art provide voltages at the drain terminals of flash EEPROM memory transistors 28. Each of the sets of switches and decoders 24, 25, and 27 is controlled by signals from a control circuit 29 to provide appropriate voltages at erase and programing to accomplish those results. In a preferred embodiment, the control circuit 29 is a microprocessor designed to provide control of all of the operations of the memory array 26 including reading, programming, and erasing among other things. The use of such a control circuit is described in U.S. patent application Ser. No. 08/086,1861, entitled *Flash Memory Array System And Method*, M. Fandrich et al, filed Jun. 30, 1993, and assigned to the assignee of the present invention. The control provided by the control circuit 29 might be provided in other arrangements by some external source of control such as a central processing unit.

At the lower right corner of FIG. 2 is shown a table which includes the voltages which are applied to the various terminals of the memory cells during the program and erase operations using positive source erase techniques. As may be seen, the erasing of the memory device 28 requires that a positive 12 volts be applied to the source terminal of the device 28, ground be applied to the gate terminal, and the drain be floated. A N type flash EEPROM memory cell has a source region which is an N doped region surrounded by a P doped substrate. The P doped substrate is grounded so that a diode junction is formed at the junction separating the source and the substrate. When twelve volts is switched to the source terminal in the positive source erase process, the diode junction between the source and substrate is biased into the breakdown region so that substantial source current flows. In fact, the value of the source voltage is actually limited by the breakdown voltage to be no more than approximately ten volts (approximately two volts of the twelve volts available is dropped through the resistive switch to the source terminals) so that the junction will not be biased into a destructive breakdown region of operation. Because of this substantial source current when the erase process is conducted using positive source erase, the source of the high erase voltage must be able to furnish a substantial amount of current. Prior to the present invention, it was not believed that such an amount of current could be furnished by a charge pump.

On the other hand, the newer negative erase technique provides a large negative voltage (typically minus 10 volts on the gate terminal of the memory device and Vcc (5 volts in the case of the present circuit) on the source terminal. The 5 volts at the source terminal is not sufficient to break down the source-substrate junction diode of the device, and only a relatively insubstantial amount of source current flows. Consequently, though similar voltage differences are applied across the gate and source terminals of the device, the negative erase technique requires much less current from the charge pump.

Figure 3:
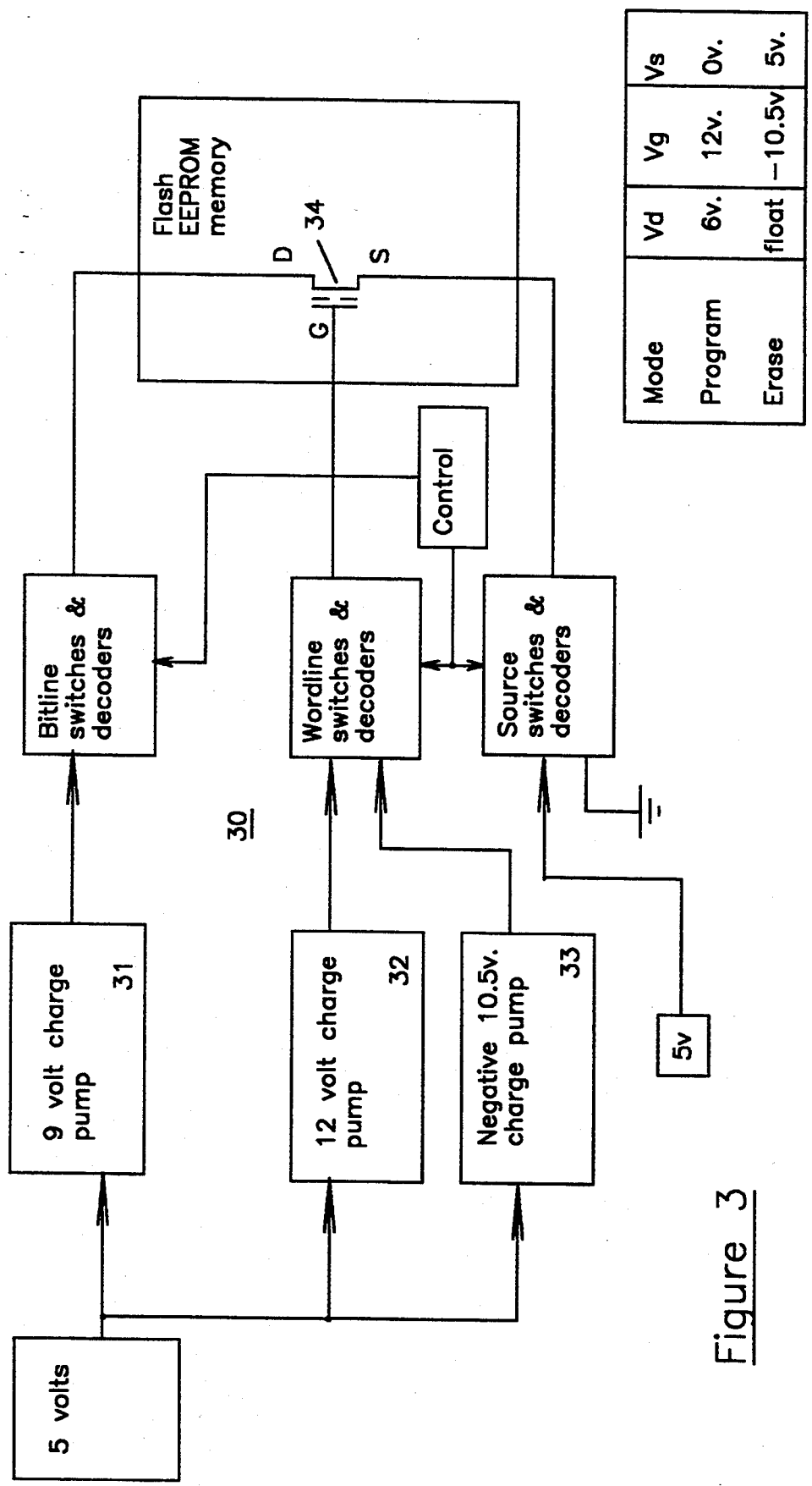
FIG. 3 is a block diagram of an integrated circuit flash EEPROM memory array utilizing charge pump circuitry to providing negative gate erase voltages.

On the other hand, as may be seen from the circuit 30 illustrated in FIG. 3, the negative erase technique substantially complicates the circuitry necessary to accomplish erase and programming of the array. For example, the circuit 30 includes in addition to the 9 volt charge pump 31 and the 12 volt charge pump 32 necessary to provide programming voltages at the drain and gate terminals of the circuit, a separate charge pump 33 for generating a negative 10.5 volts which is applied to the gate terminals of the memory cells 34 during erase and circuitry for applying Vcc to the source terminals of the array during erase. The result of using the negative erase technique is to substantially increase the number of devices used to accomplish the switching and the area of the die used by those devices.

Figure 4:
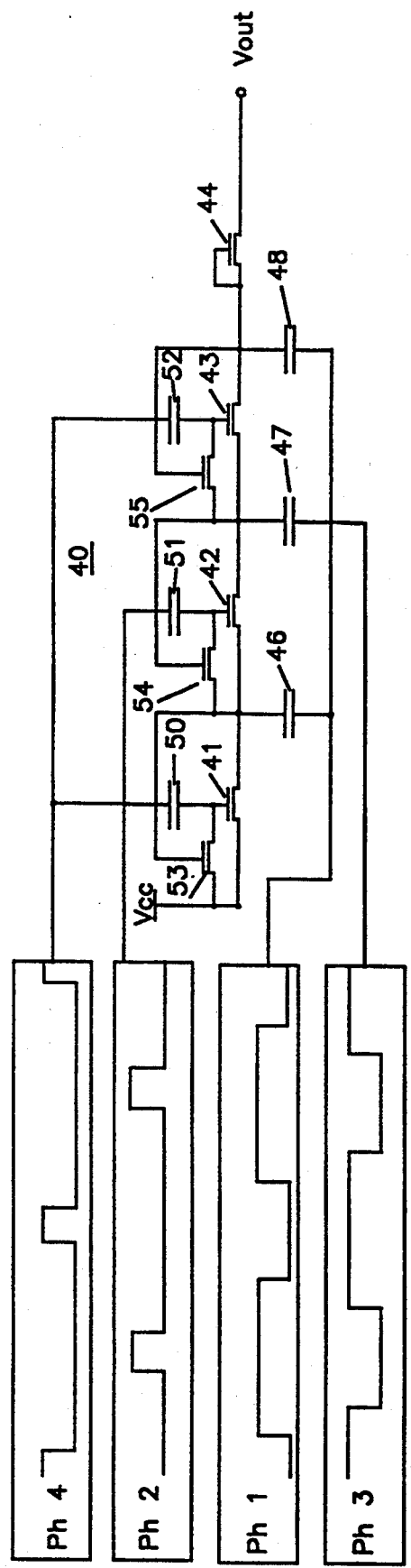
FIG. 4 is a circuit diagram illustrating a first charge pump which may be used in the circuit of FIG. 2.

FIG. 4 illustrates a first bootstrap pump arrangement which may be utilized to provide the high voltages and currents required for erasing and programming flash EEPROM memory arrays in accordance with this invention. As is shown in FIG. 4, the pump 40 includes a number of stages of N type field effect transistors 41, 42, 43, and 44 connected in series between a source of voltage Vcc and an output terminal Vout. Input clock signals are furnished to the circuit 40 from sources illustrated via capacitors 46, 47, and 48. A second set of input clock signals are furnished from sources illustrated by capacitors 50, 51, and 52. Each stage of the circuit 40 includes an N channel field effect transistor device 53, 54, or 55 used to precharge the gate terminal of the device 41, 42, or 43 of that stage.

The circuit 40 utilizes four individual clock signals shown in FIG. 4 as phase 1, phase 2, phase 3, and phase 4. Using the timing shown in FIG. 4, the phase 4 and phase 3 clocks are initially high. The phase 4 clock (called a bootstrap clock turns on each of the devices 41 and 43 so that charge may passed to the capacitor 46 from the source Vcc and to the capacitor 48 from the capacitor 47. The phase 3 clock is also high so the capacitor 47 furnishes a high voltage to the gate of the device 54 keeping that device on. When the phase 4 clock goes low turning off the devices 41 and 43 and while the device 54 is on, the capacitor 51 charges from the charge stored on the capacitor 46. Then while the phase 3 clock remains high, the phase 1 clock goes high. This increases the voltage at the capacitors 46 and 48 thereby increasing the charging rate of the capacitor 51 and simultaneously turning on the devices 53 and 55 to precharge the capacitors 50 and 52. Next the phase 3 clock drops to a low value turning off the device 54 so that the charge on the capacitor 51 is not dissipated. Then the phase 2 clock goes high providing a gate voltage at the device 42 which is higher than either the drain or source voltages. This gate voltage switches on the device 42 causing it to act like a switch and exhibit no threshold voltage drop. Thus the high voltage on the capacitor 46 due to the phase 1 clock and the stored charge from the source Vcc is rapidly transferred to charge the capacitor 47 and also to precharge the capacitor 52.

When the phase 2 clock goes low, the device 42 begins to turn off. Then the phase 3 clock goes high turning on the device 54 and positively turning off the device 42 by raising the source voltage and allowing the gate charge on the capacitor 51 to dissipate. At this point, the phase 1 clock goes low, turning off the devices 53 and 55 to fix the charge stored on the capacitors 50 and 52. This is followed by the phase 4 clock going high to turn on the devices 41 and 43 as switches without a threshold voltage drop and allow the charging of the capacitors 46 and 48.

This basic operation continues in the manner explained. The three stage pump circuit 40 illustrated in FIG. 4 furnishes approximately four times the voltage of the source Vcc at the output terminal. For example, with Vcc equal to 4.4 volts, an output voltage of 17.1 volts is furnished at the output of the pump circuit 40. More importantly, the circuit 40 provides a more efficient operation than does the conventional pump of the prior art because the circuit 40 does not have the threshold voltage drops of the typical prior art circuit. This allows it to provide more current at the output. This efficiency is a result of the bootstrapping operation by which the capacitors 50, 51, and 52 are charged and then the charging path is cut off so that the charge cannot dissipate before the devices 41, 42, and 43 are turned on. The charged gate terminal in each stage forces a higher voltage on the gate terminal than the drain terminal of each switching transistor when that switching transistor is turned on causing the switching transistor to operate without a threshold voltage drop. This increased efficiency allows the charge pump to be implemented in fewer stages and therefore require less die area on an integrated circuit than can prior art charge pump circuits.

As those skilled in the art will recognize, the four individual clock phases needed to operate the circuit 40 of the prior art are very difficult to generate. The clocks are of different lengths and must be accurately overlapped in order to provide the appropriate operation of the circuit to obtain its advantageous results. The generation of such clock phases requires a substantial amount of additional circuitry which reduces the available area of the integrated circuit board of the flash EEPROM array. In practice, it appears that such circuitry uses a lot of die area and is quite expensive.

Figure 5:
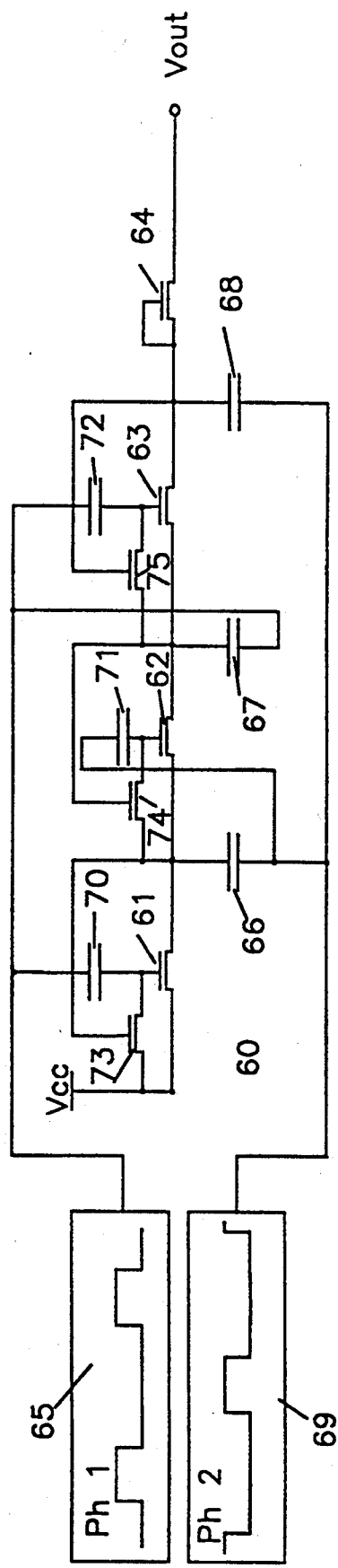
FIG. 5 is a circuit diagram illustrating a second charge pump which may be used in the circuit of FIG. 2.
Figure 6:
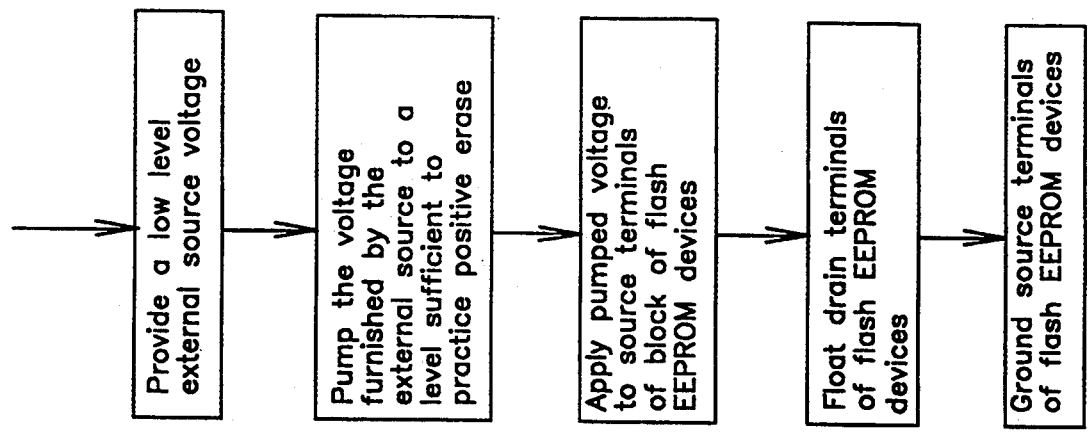
FIG. 6 is a flow chart illustrating a method of practicing the present invention.

The circuit 60 illustrated in FIG. 5 may be produced economically and will provide essentially the same results as that produced by the circuit 40 of FIG. 4. The basic circuitry of FIG. 5 is similar to that utilized in FIG. 4. However, in contrast to the circuit 40 of FIG. 4, the circuit 60 includes only two sources of clock pulses. The clock pulses produced by these sources are shown in FIG. 5. These clock pulses are applied in a unique manner in order to allow the operation of the circuit 60 to produce the desired output voltages and currents. The circuit 60 includes a number of stages of N type field effect transistors 61, 62, 63, and 64 connected in series between a source of voltage Vcc and an output terminal Vout. In the preferred embodiment of the circuit, the transistors 61, 62, and 63 as well as the other transistors are special N type devices referred to as S type devices. S type devices are basically N type devices having a very low threshold voltage level. The use and manufacture of S type devices are described in detail in U.S. Pat. Nos. 4,052,229; 4,096,584; 4,103,189; and 5,057,715. Two phases of input clock signals (phase 1 and phase 2) are furnished to the circuit 60 from sources 65 and 69 via capacitors 66, 67, and 68. The same two phases of input clock signals are furnished from sources 65 and 69 by capacitors 70, 71, and 72. Each stage of the circuit 60 includes an N channel field effect transistor device 73, 74, or 75 connected to the gate terminal of the device 61, 62, or 63 of that stage.

In contrast to the circuit 40 of FIG. 4, the two phase clock signals do not overlap and the capacitors 70, 71, and 72 are not precharged by the devices 73, 74, and 75. It may be seen that the phase 2 clock is illustrated as high initially. When this clock is high, enabling signals are applied to the gate terminals of the control devices 73 and 75 and to the gate of switching device 62. These pulses turn the control devices 73 and 75 on. The high voltage from the source 2 is also applied at the drain of the device 62, and the high voltages at both the drain and gate of the device 62 cause it to turn on. When the device 62 goes on, its drain and gate are initially at the same value, the value Vcc furnished by the phase 2 clock pulse from the capacitor 66 and the capacitor 71. However, since the phase 1 clock is low, the control device 74 joining the drain and gate of the device 62 is off. Thus, after the device 62 has been on for any period, the high voltage at the drain transfers charge from the capacitor 66 to the capacitor 67, reducing the voltage level at the drain of the device 62. This causes the voltage at the gate of the device 62 to be higher than either the drain or the source; and the device 62 switches completely on without any threshold voltage drop. Thus the transfer of charge from the capacitor 66 to the capacitor 67 does not dissipate power due to a threshold drop once the device 62 begins to turn on.

As the voltage at the drain and source of the device begin to equalize, the voltage at the gate of the control device 74 is raised so that the control device is nearly on. When the phase 2 clock pulse goes low, the device 74 turns on. The lowering of the voltage at the gate of the device 62 when the phase 2 pulse goes low causes the device 62 to begin to turn off. Simultaneously, the gate terminals of each of the control devices 73 and 75 are lowered turning off the devices 73 and 75 so that drain and gate terminals of the devices 61 and 63 are isolated from each other. When the phase 1 clock pulse goes high, the device 74 switches completely on and equalizes the gate and drain of the device 62. At the same time, the gate terminals of the devices 61 and 63 are raised by the value Vcc while the drain of the device 63 is raised by the value Vcc.

The devices 61 and 63 function similarly to the device 62 in transferring charge to the capacitors 66 and 68. The gate and drain terminals of these devices are initially equal, but then the drain voltage drops as charge is transferred to the capacitors 66 and 68 of the next stages so that the devices are switched completely on and experience no threshold voltage drop.

Thus, when the phase 1 clock goes high, the device 61 turns on; and current provided by the source Vcc charges the capacitor 66. When the phase 1 pulse goes low the device 61 switches off. Then the phase 2 clock pulse turns on the device 62; and the capacitor 66 provides stored charge and charge due to the phase 2 pulse to the capacitor 67. The device 62 switches off when the phase 2 pulse goes low. When the phase 1 pulse again goes high, the source Vcc again charges the capacitor 66. Simultaneously, the device 63 goes on and the capacitor 67 provides stored charge as well as the pulse from the phase 1 clock to charge a capacitor 68. When the phase 1 clock goes low, the device 63 turns off.

Ultimately, the charging of the capacitor 68 and the positive swing of the phase 2 clock pulse raise the voltage level on the capacitor 68 sufficiently above the level Vout to cause the conduction of the switching device 64. When the phase 2 clock later goes high, the output device 64 turns on and furnishes a pumped voltage at Vout equal approximately to the number of stages multiplied by the value of Vcc less the Vt drop of the output device 64. This provides the desired output voltage while furnishing the high level of current necessary to erase and program flash EEPROM memory arrays.

Thus, as may be seen, the arrangement of FIG. 5 provides a reliable charge pump circuit capable of producing high levels of current efficiently with a substantial reduction in the circuitry and die space necessary in the circuit of FIG. 4.

It should be noted that the smaller charge pump required to furnish the voltage used at the drain terminals of the flash EEPROM memory cells during programming of the array may be provided by charge pumps identical to those described in each of FIGS. 4 and 5 with the exception that fewer stages are used. For example, a charge pump having only two stages is capable of providing a 9.5 volt output which may be used at the drain terminals of the memory cells during programming.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A computer system comprising:
   a central processor;
   an output display;
   a memory arrangement comprising
      a flash EEPROM memory array including a plurality of floating gate field effect transistor devices,
      a first charge pump for providing a first positive voltage to be applied to drain terminals of the floating gate field effect transistor devices during a programming operation,
      a second charge pump for providing a second positive voltage to be applied to source terminals of the floating gate field effect transistor devices during an erasing operation,
      and switching circuitry responsive to control signals indicating the existence of a program or an erase operation
         for connecting voltage from the first charge pump to the drain terminals, ground to the source terminals, and the voltage from the second charge pump to the gate terminals of the floating gate field effect transistor devices during a programming operation, and
         for disconnecting the voltage furnished by the first charge pump from the drain terminals, connecting ground to the gate terminals, and the voltage from the second charge pump to the source terminals of the floating gate field effect transistor devices during an erasing operation; and
   a system bus for transferring data and addresses between the central processor, the memory arrangement, and the output display.

2. A computer system as claimed in claim 1 in which the first charge pump is capable of furnishing approximately 9 volts and the second charge pump is capable of furnishing approximately 12 volts.

3. A computer system as claimed in claim 1 in which the first charge pump is a bootstrap charge pump capable of furnishing approximately 9 volts and the second charge pump is a bootstrap charge pump capable of furnishing approximately 12 volts.

4. A computer system as claimed in claim 1 in which each of the charge pumps functions in response to four individual phases of clock pulses.

5. A computer system as claimed in claim 1 in which each of the charge pumps functions in response to only two individual phases of clock pulses.

6. A memory arrangement comprising
   a flash EEPROM memory array including a plurality of floating gate field effect transistor devices,
   a first charge pump for providing a first positive voltage to be applied to drain terminals of the floating gate field effect transistor devices during a programming operation,
   a second charge pump for providing a second positive voltage to be applied to source terminals of the floating gate field effect transistor devices during an erasing operation,
   and switching circuitry responsive to control signals indicating the existence of a program or an erase operation
      for connecting voltage from the first charge pump to the drain terminals, ground to the source terminals, and the voltage from the second charge pump to the gate terminals of the floating gate field effect transistor devices during a programming operation, and
      for disconnecting the voltage furnished by the first charge pump from the drain terminals, connecting ground to the gate terminals, and the voltage from the second charge pump to the source terminals of the floating gate field effect transistor devices during an erasing operation.

7. A memory arrangement as claimed in claim 6 in which the first charge pump is capable of furnishing approximately 9 volts and the second charge pump is capable of furnishing approximately 12 volts.

8. A memory arrangement as claimed in claim 6 in which the first charge pump is a bootstrap charge pump capable of furnishing approximately 9 volts and the second charge pump is a bootstrap charge pump capable of furnishing approximately 12 volts.

9. A memory arrangement as claimed in claim 6 in which each of the charge pumps functions in response to four individual phases of clock pulses.

10. A memory arrangement as claimed in claim 6 in which each of the charge pumps functions in response to only two individual phases of clock pulses.

11. A computer system comprising:
    central processing means;
    output display means;
    means for providing storage for data comprising flash EEPROM memory array means including a plurality of floating gate field effect transistor devices, first charge pump means for providing a first positive voltage to be applied to drain terminals of the floating gate field effect transistor devices during a programming operation, second charge pump means for providing a second positive voltage to be applied to source terminals of the floating gate field effect transistor devices during an erasing operation, and switching means responsive to control signals indicating the existence of a program or an erase operation for connecting voltage from the first charge pump means to the drain terminals, ground to the source terminals, and the voltage from the second charge pump means to the gate terminals of the floating gate field effect transistor devices during a programming operation, and for disconnecting the voltage furnished by the first charge pump means from the drain terminals, connecting ground to the gate terminals, and the voltage from the second charge pump means to the source terminals of the floating gate field effect transistor devices during an erasing operation; and system bus means for transferring data and addresses between the central processing means, the means for providing storage for data, and the output display means.

12. A computer system as claimed in claim 11 in which the first charge pump means is capable of furnishing approximately 9 volts and the second charge pump means is capable of furnishing approximately 12 volts.

13. A computer system as claimed in claim 11 in which the first charge pump means is a bootstrap charge pump capable of furnishing approximately 9 volts and the second charge pump means is a bootstrap charge pump capable of furnishing approximately 12 volts.

14. A computer system as claimed in claim 11 in which each of the charge pump means functions in response to four individual phases of clock pulses.

15. A computer system as claimed in claim 11 in which each of the charge pump means functions in response to only two individual phases of clock pulses.

16. A memory arrangement comprising a flash EEPROM memory array including a plurality of floating gate field effect transistor devices, first charge pump means for providing a first positive voltage to be applied to drain terminals of the floating gate field effect transistor devices during a programming operation, second charge pump means for providing a second positive voltage to be applied to source terminals of the floating gate field effect transistor devices during an erasing operation, and switching means responsive to control signals indicating the existence of a program or an erase operation for connecting voltage from the first charge pump means to the drain terminals, ground to the source terminals, and the voltage from the second charge pump means to the gate terminals of the floating gate field effect transistor devices during a programming operation, and for disconnecting the voltage furnished by the first charge pump means from the drain terminals, connecting ground to the gate terminals, and the voltage from the second charge pump means to the source terminals of the floating gate field effect transistor devices during an erasing operation.

17. A memory arrangement as claimed in claim 16 in which the first charge pump means is capable of furnishing approximately 9 volts and the second charge pump means is capable of furnishing approximately 12 volts.

18. A memory arrangement as claimed in claim 16 in which the first charge pump means is a bootstrap charge pump capable of furnishing approximately 9 volts and the second charge pump means is a bootstrap charge pump capable of furnishing approximately 12 volts.

19. A memory arrangement as claimed in claim 16 in which each of the charge pump means functions in response to four individual phases of clock pulses.

20. A memory arrangement as claimed in claim 16 in which each of the charge pump means functions in response to only two individual phases of clock pulses.

21. A method for erasing a flash EEPROM memory array including a plurality of floating gate field effect transistor devices comprising the steps of:

pumping a voltage provided from a source of low voltage to a high positive voltage level sufficient to utilize for a positive source erase operation at source terminals of the floating gate field effect transistor devices, applying the high voltage pumped to the source terminals of the floating gate field effect transistor devices, floating the drain terminals of the floating gate field effect transistor devices, and applying ground to the source terminals of the floating gate field effect transistor devices.

* * * * *

UNITED STATES PATENT AND TRADEMARK OFFICE
CERTIFICATE OF CORRECTION

PATENT NO. : 5,414,669
DATED : May 9, 1995
INVENTOR(S) : Tedrow et al

It is certified that error appears in the above-indentified patent and that said Letters Patent is hereby corrected as shown below:

On the title page: Item [75]

change "Jahanshir. J. Jayanifard" to
--Jahanshir J. Javanifard--.

Signed and Sealed this

Sixteenth Day of April, 1996

Attest:

BRUCE LEHMAN

*Attesting Officer*  *Commissioner of Patents and Trademarks*